United States Patent [19]

Schuster

[11] 4,001,601
[45] Jan. 4, 1977

[54] TWO BIT PARTITIONING CIRCUIT FOR A DYNAMIC, PROGRAMMED LOGIC ARRAY

[75] Inventor: Stanley Everett Schuster, Granite Springs, N.Y.

[73] Assignee: International Business Machines Corporation, Armonk, N.Y.

[22] Filed: Sept. 25, 1975

[21] Appl. No.: 616,734

[52] U.S. Cl. ............................ 307/205; 307/215; 307/246; 307/270; 307/DIG. 1; 307/DIG. 4; 307/DIG. 5

[51] Int. Cl.² ............... H03K 19/08; H03K 19/34; H03K 17/10; H03K 17/56

[58] Field of Search ......... 307/205, 215, 304, 270, 307/DIG. 4, DIG. 5, 207, 238, 246, 251, DIG. 1

[56] References Cited

UNITED STATES PATENTS

| 3,601,627 | 8/1971 | Booher | 307/205 |
|---|---|---|---|
| 3,644,904 | 2/1972 | Baker | 307/DIG. 5 |
| 3,665,473 | 5/1972 | Heimbigner | 307/215 X |
| 3,778,784 | 12/1973 | Karp et al. | 307/DIG. 4 |
| 3,906,464 | 9/1975 | Lattin | 340/173 R |

OTHER PUBLICATIONS

West, "Practical Circuit Design Using M.O.S."; Design Electronics, vol. 8, No. 6; 3/1971; pp. 30–32, 37–38.

*Primary Examiner*—John S. Heyman
*Assistant Examiner*—Larry N. Anagnos
*Attorney, Agent, or Firm*—Philip Young

[57] ABSTRACT

A two bit partitioning circuit for a dynamic programmed logic array which introduces two stages of delay in the signal path in one clock cycle, with minimum power dissipation. The circuit has two primary inputs and four outputs which serve as inputs to a bootstrap driver which produces an output signal to the programmed logic array. A basic path through the circuit consists of two stages, the first stage comprising two active devices (FET) and a first capacitive means, while the second stage comprises three active devices and a second capacitive means. The major portion of the capacitance of the second stage is provided by the capacitance of the bootstrap driver. The stages are dynamic with the discharge speed of the first stage being much faster than that of the second stage thereby enabling a signal to propagate through the two stages in one clock cycle, with the only power dissipation being that required to charge the two capacitive means.

9 Claims, 13 Drawing Figures

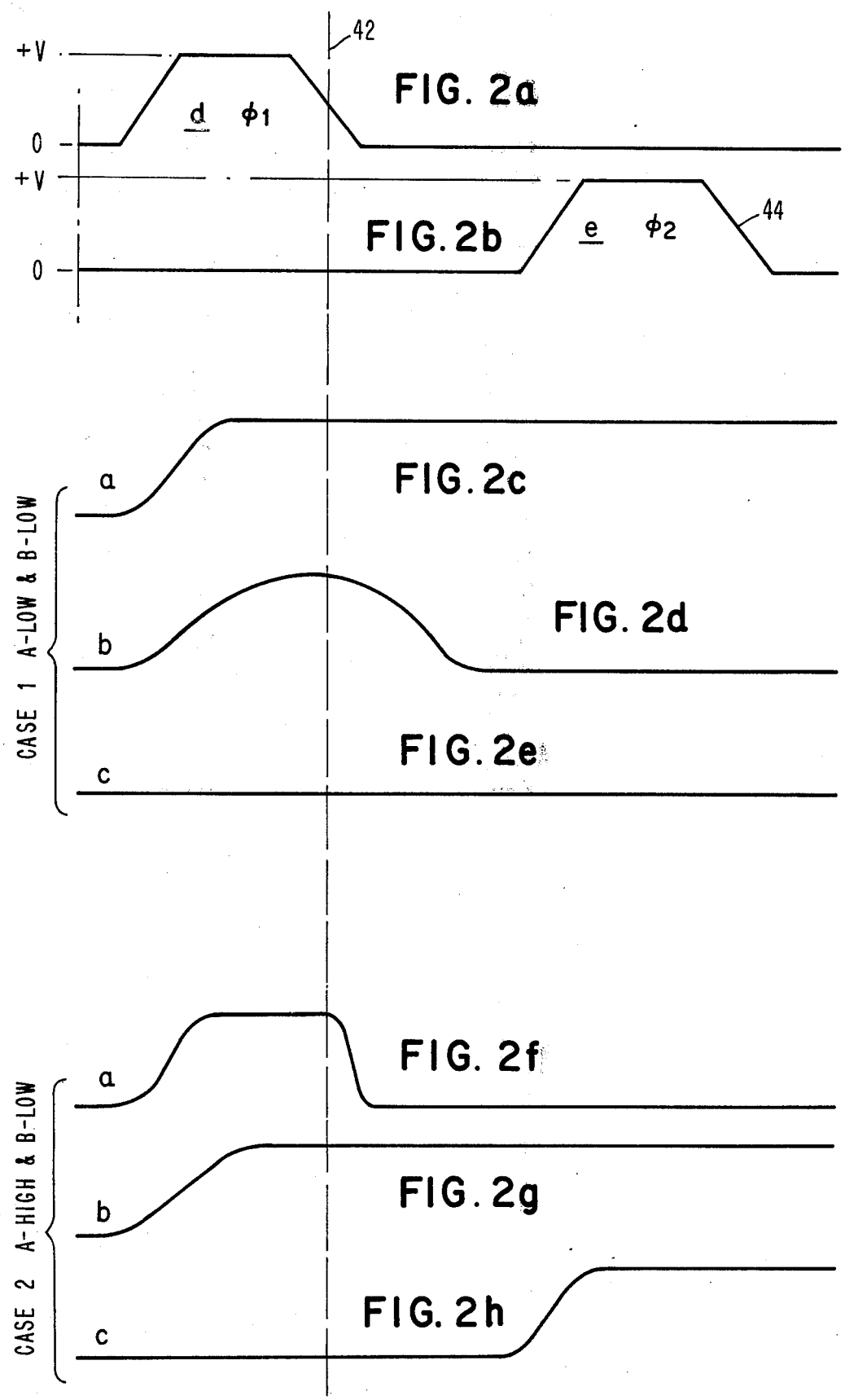

TWO BIT PARTITIONING CIRCUIT FOR A DYNAMIC, PROGRAMMED LOGIC ARRAY

BACKGROUND OF THE INVENTION

1. Field of the Invention

The present invention relates to programmed logic arrays and more particularly to a 2-bit partitioning circuit for a dynamic, programmed logic array.

2. Description of the Prior Art

The programmed logic arrays (PLA's) are read-only structures that are programmed to perform both sequential and combinational logic. The combinational logic is implemented by means of sum-of-product functions as performed by AND arrays and OR arrays in cascade. The sequential logic is achieved by means of storage elements in the form of flip-flips or registers that may be driven in either a set/reset or toggle mode as a function of the pattern stored in a portion of the OR array. The feedback register is connected to internal inputs to the AND array through a feedback path that is internal to the PLA chip.

The PLA has basically a table look-up structure, where the AND array forms the look-up library and the OR array forms the resultant output for the operation. The AND array consists of many product terms (words) and is partitioned into two sections: the external field and the feedback field from the feedback register. Both of these fields are processed in parallel in the AND array to select words in the OR array. The OR array performs the logical OR operation on the values written in the selected words. The OR array is also partitioned into two fields: one field is gated to the external outputs, the other operates on the feedback register.

The total function of an array may be thought of as a sum-of-product expression. Because the product formation is done in the decoder, that part of the array is termed the AND or SEARCH array. Similarly, as the summing is done in what for a conventional memory would be the bit pattern, that part is termed the OR or READ array. In a conventional PLA, the true and complement values of the primary inputs are provided to the SEARCH or AND array. Thus, for two primary inputs A and B, the signals A, $\overline{A}$, B and $\overline{B}$ are formed as inputs to the SEARCH array. Suppose that the input signals to the SEARCH array were defined as $Un = \overline{A}n + \overline{B}n$
$Vn = \overline{A}n + Bn$
$Xn = An + \overline{B}n$
$Yn = An + Bn$.

Providing such signals implements 2-bit partitioning. The extension of arrays by means of 2-bit partitioning generally provides more efficient implementation of functions by reducing the number of array product terms required.

SUMMARY OF THE INVENTION

It is an object of the present invention to provide a dynamic circuit for performing 2-bit partitioning for a PLA with only one clock time to perform two levels of logic.

It is another object to provide a dynamic circuit for performing 2-bit partitioning which is simple, uses low power and is fast. These and other objects are provided by the present invention which provides a 2-bit partitioning circuit for a dynamic programmed logic array which introduces two stages of delay in the signal path in one clock cycle, with minimum power dissipation. The circuit has two primary inputs and four outputs which serve as inputs to a bootstrap driver which produces an output signal to the programmed logic array. A basic path through the circuit consists of two stages, the first stage comprising two active devices (FET's) and a first capacitive means. The first primary input is connected to the gate of one of the active devices, and the first capacitive means comprises a capacitor connected to a common drain/source node $a$ of the two active devices. The second stage comprises three active devices (FET's) and a second capacitive means. The gate of a first one of the three active devices is connected to the node $a$, and the three active devices are all connected to a common drain/source node $b$ which is also connected as a gate input to a FET included in the bootstrap driver. The second primary input is connected to the gate of one of the three active devices in the second stage. A first phase voltage is applied to the gate or source terminals of the active devices in both stages, and a second phase voltage is applied to the bootstrap driver. The major portion of the capacitance of the second stage is provided by the capacitance of the bootstrap driver. The stages are dynamic with the discharge speed of the first stage being much faster than that of the second stage, thereby enabling a signal to propagate through the two stages in one clock cycle, with the only power dissipation being that required to charge the two capacitive means.

BRIEF DESCRIPTION OF THE DRAWINGS

FIGS. 2a through 2h are timing diagrams showing the clocks and output signals at various points of the circuit shown in FIG. 1b for two illustrative conditions;

DESCRIPTION OF THE PREFERRED EMBODIMENTS

Figure 1A:
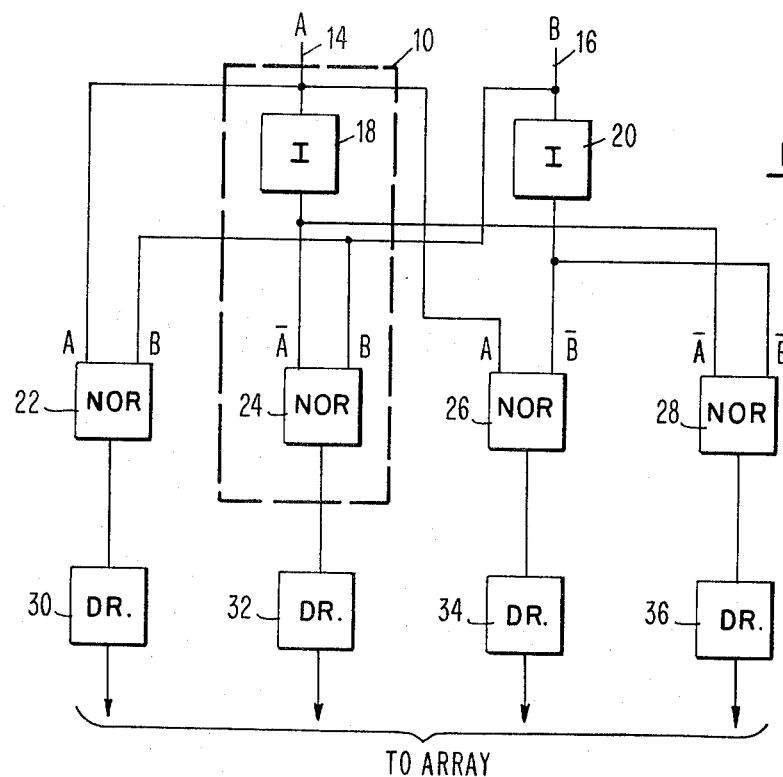
FIG. 1a is a block diagram of the 2-bit partitioning circuit and FIG. 1b is a circuit diagram of a path through the 2-bit partitioning circuit, illustrative of the present invention.

Referring to FIG. 1a, there is shown a circuit block diagram of a two bit partitioning circuit incorporating the input decoder of the present invention. The input decoder is indicated by the circuitry within the broken line circle 10 shown in both FIGS. 1a and 1b. The two primary inputs A and B are applied on lines 14 and 16, respectively, to input inverters 18 and 20. The primary inputs A and B as well as the inverted signals $\overline{A}$ and $\overline{B}$ formed by inverters 18 and 20 are applied to decoders in the form of NOR circuits 22, 24, 26, 28 which provide the signals $A + B$, $\overline{A} + B$, $A + \overline{B}$ and $\overline{A} + \overline{B}$ thereby implementing 2-bit partitioning. The output of the decoders 22, 24, 26 and 28 is applied to the programmed logic arrays via bootstrap drivers 30, 32, 34 and 36.

Figure 1B:
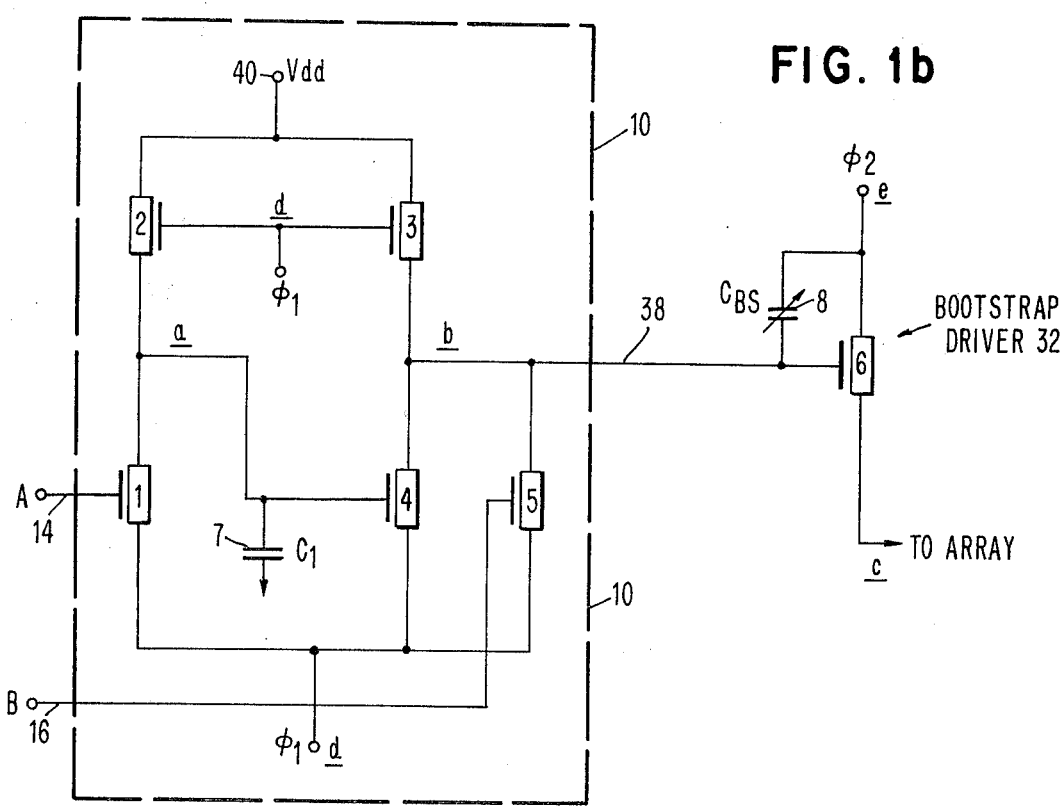

Referring to FIG. 1b, there is shown the input decoder 10 for the 2-bit partitioning circuit which is connected between the primary input lines 14 and 16 and the output line 38 to the bootstrap driver 32 for the programmed logic array (PLA). Circuit 10 consists of two stages, the first stage comprising two active devices (FETs) 1 and 2 and a capacitor 7. The first primary input line 14 is connected to the gate of FET 1 and the capacitor 7 is connected to a common node $a$ of FETs 1 and 2. The second stage comprises three active devices, shown as FETs 3, 4 and 5, and a second capacitor 8. Capacitors 7 and 8 are also indicated by $C_1$ and $C_{BS}$, respectively. For purposes of the description, each of the field effect transistors (FETs 1-5) shown in FIG. 1b is an N-channel enhancement mode device which is OFF or non-conducting with zero potential between its gate and source electrode, and is rendered conductive when a positive pulse of sufficient amplitude is applied to the gate electrode.

Capacitor $C_1$ is connected to a common node $a$ of FETs 1 and 2, which node $a$ is also connected to the gate electrode of FET 4. The electrodes of each of the three FETs 3, 4 and 5 in the second stage are connected to a common node $b$ which is indicated by the output line 38 connected as a gate input to a FET 6 in the bootstrap driver 32. The second primary input B is connected via line 16 to the gate of FET 5 in the second stage. A pulsed source, indicated by $\phi 1$, provides a phase voltage to the common node $d$ which is electrically connected to the gates of FETs 2 and 3 and to the electrodes of FETs 1, 4 and 5 as shown. A second pulsed source indicated by $\phi 2$ provides a phase voltage at node $e$ to an electrode of FET 6 of the bootstrap driver. Each of the phase voltages provided by pulsed sources $\phi 1$ and $\phi 2$ is a positive voltage +V at the respective clock intervals as shown by the waveforms of FIGS. 2a and 2b. The drain terminals of FETs 2 and 3 are connected at line 40 to a positive voltage source $V_{dd}$. The bootstrap capacitor $C_{BS}$ is connected between the node $e$ and the gate of FET 6. The output of the bootstrap driver 32 is applied via node $c$ to the array.

The operation of the circuit 10 of FIG. 1b is as follows. When $\phi 1$ goes high to a positive voltage, FETs 2 and 3 are turned on to pre-charge nodes $a$ and $b$ to Vdd. No static power dissipation occurs since the source of FETs 1, 4 and 5, i.e., node $d$, is high.

Two primary input conditions must now be considered to illustrate the circuit operation. For the first condition input A is low and input B is low. For the second condition, input A is high and input B is low. Considering now the first condition where both inputs A and B are low, $\phi_1$ goes low turning off FETs 2 and 3. Device 1 is off since input A is low. Since node $a$ is high, device 4 turns on when node $d$ ($\phi_1$) falls below the threshold voltage of device 4, causing node $b$ to discharge through device 4. FIGS. 2a and 2b represent the voltage waveforms at nodes $d$ and $e$, respectively, and FIGS. 2c, 2d and 2e represent the waveforms of nodes $a$, $b$, and $c$, respectively, for the first condition described above. Dotted line 42 indicates the time when node $d$ ($\phi_1$) falls below the threshold voltage of device 4. It is noted that there must be sufficient time between $\phi_1$ going low and $\phi_2$ going high for node $b$ to completely discharge. Also, the node $b$ is held low through device 4 after $\phi_1$ falls, since node $a$ remains high.

Figure 3A:
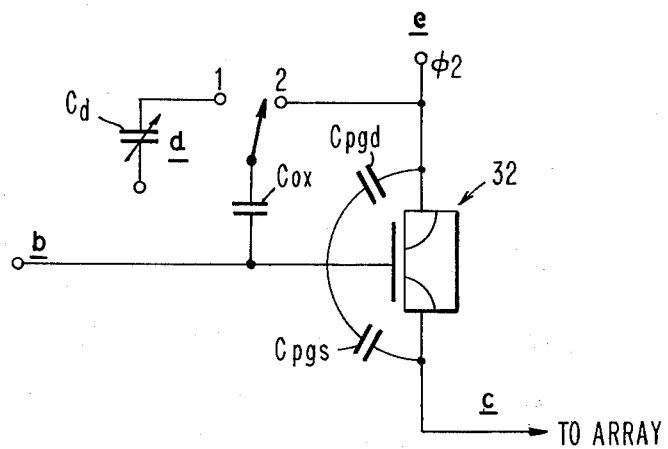
FIG. 3a is a circuit diagram of a conventional bootstrap driver.
Figure 3B:
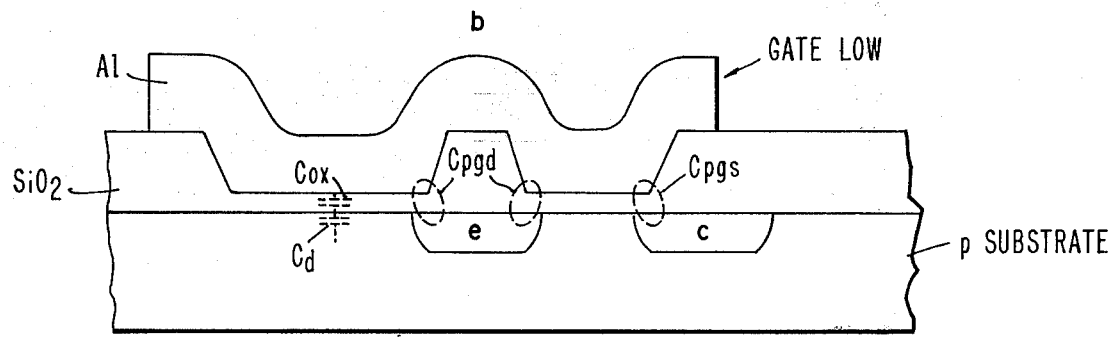
FIGS. 3b and 3c are cross-sectional views of the driver structure for the different modes of operation indicated.

FIG. 3a is circuit diagram showing the capacitances of the bootstrap driver, and FIG. 3b shows the cross-sectional view of the bootstrap driver for the first condition described above. As is well known in the art, the bootstrap driver comprises a conventional FET device designed with additional metal and a thin oxide region producing the bootstrap capacitance $C_{BS}$, which includes a depletion layer capacitance and an oxide capacitance.

Continuing with the description of the operation of the circuit 10 for the first input description, with node $b$ low, the capacitance Cox of the bootstrap driver 32 is switched to position 1, as shown by the FIGS. 3a and 3b. Thus, the only capacitance connecting node $e$ to node $b$ is the parasitic capacitance Cpgd between the gate and drain electrodes: when $\phi 2$ goes high, node $b$ remains low since the parasitic coupling from Cpgd is small and, in addition, device 4 is turned on clamping mode $b$ to ground. The parasitic coupling would be computed as follows:

$$\Delta V_{parasitic} = V\phi \times \frac{C_{pgd}}{C_{pgd} + C_{pgs} + \frac{C_{ox}C_d}{C_{ox}+C_d}}$$

if it were not for the clamp through device 4. Since device 6 is off node $c$ remains low and there is no output signal from the driver 32.

Figure 3C:
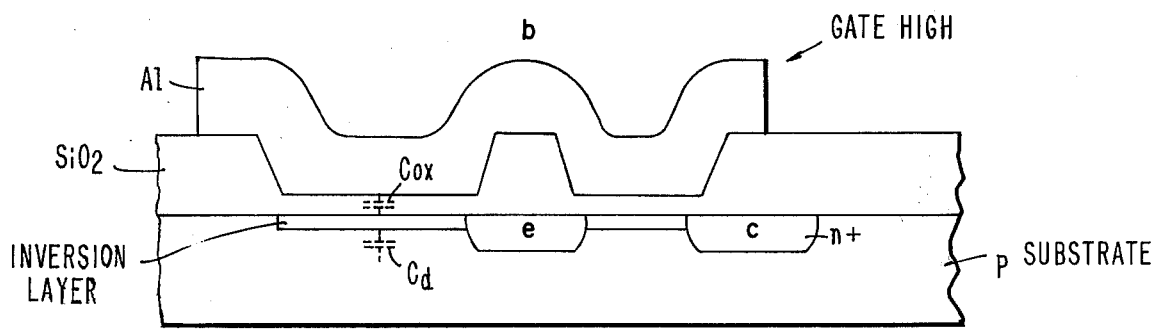

The circuit operation for the second condition will now be described wherein input A is high and input B is low. The voltage waveforms at the nodes $a$, $b$ and $c$ are shown in FIGS. 2f, 2g and 2h, respectively. Also, FIG. 3C shows a cross-sectional view of structure of the bootstrap driver for second condition. Input phase voltage $\phi 1$ goes low, turning off FETs 2 and 3. When the voltage between input A and $\phi 1(d)$ and node $a$ and $\phi 1(d)$ is greater than the threshold voltage of FETs 1 and 4, a race condition exists, i.e., both the device 1 and the device 4 attempt to discharge. At this point, the capacitance of node $b$ is approximately Cox since node $b$ is high and the bootstrap capacitance of FIG. 3a is in position 2, for the reason that the surface under the capacitance is inverted as shown in FIG. 3c connecting it to diffusion $e$.

If the ratio of

If the ratio of $$\frac{C_{BS}}{WLR_4} \approx \frac{C_{ox}}{WLR_4} > \frac{C_1}{WLR_1}$$

where WLR is the width to length ratio of the respective FET device indicative of the current carrying capacity, then node $a$ will discharge more rapidly than node $b$. In addition, the voltage on the gate of device 1 is fixed whereas the voltage on the gate of device 4 is decreasing. Therefore, node $a$ will discharge whereas node $b$ will remain high, thereby providing the desired result shown in FIGS. 2f and 2g.

After the phase voltage $\phi 1$ falls, node $b$ is high, device 6 is turned on, there is an inversion layer under the gate and the capacitance Cox is connected to diffusion $e$ through this inversion layer, as shown in FIG. 3c. When the phase voltage $\phi 2(e)$ goes high, the gate of device 6 (node $b$) is pulled higher through the bootstrap capacitance Cox which keeps device 6 on as the output node $c$ rises. If Cox is a significant portion of the total capacitance on node $b$, node $b$ will be bootstrapped to a voltage high enough to keep device 6 turned on such that the output voltage on node $c$ will rise to approximately the $\phi 2$ phase voltage, as shown in FIG. 2h. It should be noted that devices 3, 4 and 5 are all off during this operation allowing node $b$ to be bootstrapped to approximately $Vdd + V\phi_2$.

Summarizing the operation of the circuit of FIG. 1b, during the up transition of $\phi_1$, nodes $a$ and $b$ are charged to $V_{dd}$. The conditions of interest when $\phi_1$ goes low are input B low and input A both low and high. In the first condition where input A is low, FET 1 will be off node $a$ will remain high and node $b$ will discharge through FET 4. The second condition involves a race condition with input A high and input B low since both nodes *a* and *b* will attempt to discharge. The circuit is designed so that for this case node *a* will discharge and node *b* will remain high. Two things make this possible. First, because of the bootstrap capacitance $C_{ox}$, node *b* is more heavily loaded and therefore the C/WLR ratio of node *b* is greater than the C/WLR ratio of node *a*. Secondly, the voltage on input A is fixed whereas the voltage on node *a* is falling which makes the race go in the right direction.

The circuit shown in FIG. 1*b* can also be used as a buffer stage for providing capacitive isolation. More specifically, if the A input line 14 shown in FIG. 1*b* were a heavily loaded capacitive node, which is to be coupled into the bootstrap driver 32, then the circuit indicated by the dotted line 10 in FIG. 1*b*, with the exception of the input B line 16 and the FET 5, would be used to provide capacitive isolation between the heavily loaded input A and the bootstrap driver 32. It is noted that since the above description of the operation of the circuit of FIG. 1*b* involves two conditions where the input B is at a low level and therefore the FET 5 is in the off state, then the buffer circuit will function in an identical manner as to that previously described. Let us assume that the capacitance at the A input line 14 is referred to as $C_A$, the capacitance at the node *b* on the line is referred to as $C_b$, and the relationship of the two capacitances is that $C_A$ is much greater than $C_b$. If input A were connected directly into the bootstrap driver 32, the bootstrap driver would not function. This is caused by the large capacitance $C_A$ on the bootstrap driver input which prevents the bootstrapping action from taking place. Employment of the circuit 10, with the exception of FET 5, provides capacitive isolation between the input node A and node *b* with the logical level between such nodes being the same. Such capacitive isolation provided by this circuit thereby enables the bootstrap driver to function. The capacitive isolation or buffer circuit 10 shown in FIG. 1*b*, in conjunction with the bootstrap driver, can be used (a) between an AND array and an OR array of a programmed logic array, and (b) on the outputs of an OR array of a PLA.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An input decoder for a two-bit partitioning circuit of a programmed logic array, comprising:
    a first stage including two field effect transistors (FETs) having a respective first one of their electrode terminals connected to a common first node, and a first capacitive means including a capacitor having one side connected to said first node, with the gate of a first FET in said first stage being connected to a first primary input line to the two-bit partitioning circuit;
    a second stage including three FETs, each having a first one of their electrode terminals connected to a common second node, a first of said three FETs having its gate connected to said first node and its second electrode terminal connected to a third node together with both a second electrode terminal of said first FET in said first stage and a second electrode terminal of a second FET in said second stage, said second FET in said second stage having its gate connected to a second primary input line to the two-bit partitioning circuit, and the second FET in said first stage and a third FET in said second stage having their gates connected to said third node for receiving a phase voltage and having their respective second electrode terminals connected to a voltage source; and
    bootstrap driver means including a FET having its gate connected to said second node, said bootstrap driver means including second capacitive means with a capacitance which is much greater than the capacitance of said first capacitor such that the discharge speed of said first stage is much faster than that of said second stage, said FET of said bootstrap driver means providing one of four outputs of said two-bit partitioning circuit: whereby a signal is caused to propagate through the two stages in one clock cycle, with the only power dissipation being essentially that required to charge the two capacitive means.

2. An input decoder as recited in claim 1, wherein said FET in said bootstrap driver is connected at one of its electrode terminals to a source of a second phase voltage.

3. An input decoder as recited in claim 1, wherein the ratio of the oxide capacitance of said bootstrap driver divided by the width to length ratio of said first FET in said second stage is greater than the ratio of the value of the capacitor in said first capacitance means divided by the width to length ratio of the first FET in said first stage.

4. An input decoder as recited in claim 1, wherein said second capacitive means includes an oxide capacitance of the bootstrap driver.

5. A two-bit partitioning circuit having two primary inputs and four outputs to a programmed logic array, said circuit including at least one decoder circuit comprising:
    a first stage comprising two FET devices and a first capacitive means, with the first primary input connected to the gate of a first one of the FET devices, and the first capacitive means comprises a capacitor connected to a common node *a* of the two FET devices;
    a second stage comprising three FET devices, the gate of a first one of said three FET devices being connected to said node *a*, each of the three FET devices being connected to a common node *b*, and the second primary input being connected to the gate of a second one of said three FET devices in the second stage;
    means for applying a phase voltage to a common node *d* at the gate of the second device in said first stage, the gate of third device in said second stage and to the other electrode terminals of the three remaining FET devices in both stages;
    means for applying a voltage source to the drain terminals of the second device in said first stage and the third device in said second stage; and
    bootstrap driver means including a FET device having its gate connected to said node *b*, said bootstrap driver means including capacitive means with a capacitance which is much greater than the capacitance of said first capacitance means such that the discharge speed of said first stage is much faster than that of said second stage, said FET device of said bootstrap driver providing one of said four outputs to said programmed logic array; whereby a signal is caused to propagate through the two stages in one clock cycle, with the only power dissipation being essentially that required to charge the two capacitive means.

6. An input decoder as recited in claim 5, wherein said FET in said bootstrap driver is connected at one of its electrode terminals to a source of a second phase voltage.

7. An input decoder as recited in claim 5, wherein the ratio of the oxide capacitance of said bootstrap driver divided by the width to length ratio of said first FET in said second stage is greater than the ratio of the value of the capacitor in said first capacitance means divided by the width to length ratio of the first FET in said first stage.

8. An input decoder as recited in claim 5, wherein said second capacitive means includes an oxide capacitance of the bootstrap driver.

9. A buffer circuit for providing capacitive isolation, comprising:
a first stage including two field effect transistors (FETs) having a respective one of their electrode terminals connected to a common first node, and a first capacitive means including a capacitor having one side connected to said first node, with the gate of a first FET in said first stage being connected to a high capacitance input;
a second stage including two FETs, each having one of their electrodes connected to a common second node, a first of said two FETs having its gate connected to said first node and its other electrode terminal connected to a third node in common with an electrode terminal of said first FET in said first stage, and a second FET in said first stage and a second FET in said second stage having their gates connected to said third node for receiving a first phase voltage and having their drain terminals connected to a voltage source; and
bootstrap driver means including a FET having its gate connected to said second node, said bootstrap driver means including second capacitive means with a capacitance which is much greater than the capacitance of said first capacitor such that the discharge speed of said first stage is much faster than that of said second stage:
whereby a signal is caused to propagate through the two stages in one clock cycle, with the only power dissipation being essentially that required to charge the two capacitive means.

* * * * *